(12) United States Patent
Kim et al.

(10) Patent No.: US 12,431,340 B2
(45) Date of Patent: Sep. 30, 2025

(54) EXHAUST GAS PROCESSING APPARATUS HAVING PLASMA SOURCE AND SUBSTRATE PROCESSING APPARATUS INCLUDING THE SAME

(71) Applicant: SAMSUNG ELECTRONICS CO., LTD., Suwon-si (KR)

(72) Inventors: Jaehyun Kim, Suwon-si (KR); Kookjin Ann, Suwon-si (KR); Suji Gim, Suwon-si (KR); Taijong Sung, Suwon-si (KR); Sunwoo Yook, Suwon-si (KR); Young Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 110 days.

(21) Appl. No.: 18/390,956

(22) Filed: Dec. 20, 2023

(65) Prior Publication Data

US 2024/0249925 A1    Jul. 25, 2024

(30) Foreign Application Priority Data

Jan. 19, 2023   (KR) ........................ 10-2023-0007816

(51) Int. Cl.
*H01J 37/32* (2006.01)

(52) U.S. Cl.
CPC .. *H01J 37/32844* (2013.01); *H01J 37/32449* (2013.01); *H01J 37/32623* (2013.01); *H01J 37/32899* (2013.01); *H01J 2237/327* (2013.01)

(58) Field of Classification Search
CPC .......... H01J 37/32844; H01J 37/32449; H01J 37/32623; H01J 37/32899; H01J 2237/327
See application file for complete search history.

(56) References Cited

U.S. PATENT DOCUMENTS

| | | | |
|---|---|---|---|
| 10,428,426 B2 * | 10/2019 | Raj | C23C 16/50 |
| 11,479,854 B2 * | 10/2022 | Fiedler | H01L 21/28556 |
| 11,817,297 B2 * | 11/2023 | Spuller | C23C 16/4408 |
| 11,965,241 B2 * | 4/2024 | Chopra | H01L 21/67115 |
| 2007/0286766 A1 | 12/2007 | Choi | |
| 2017/0294292 A1 * | 10/2017 | Hawrylchak | H01J 37/32357 |
| 2018/0073137 A1 * | 3/2018 | Xavier | C23C 16/4405 |
| 2018/0135171 A1 * | 5/2018 | L'Heureux | C23C 16/4412 |
| 2020/0402780 A1 * | 12/2020 | Hawrylchak | H01J 37/32899 |

(Continued)

FOREIGN PATENT DOCUMENTS

| | | | |
|---|---|---|---|
| KR | 10-1213689 B1 | 12/2012 | |
| KR | 10-1642129 B1 | 7/2016 | |

(Continued)

*Primary Examiner* — Adam D Houston
(74) *Attorney, Agent, or Firm* — Fish & Richardson P.C.

(57) ABSTRACT

An exhaust gas processing apparatus includes a first chamber and a second chamber in parallel between a processing chamber and an exhaust pump, at least one foreline connecting the first chamber and the second chamber to the processing chamber and the exhaust pump, a first plasma source connected to the first chamber and the second chamber, and a second plasma source connected to the first chamber and the second chamber, wherein the first plasma source generates a first treatment material, and the second plasma source generates a second treatment material, different from the first treatment material.

20 Claims, 9 Drawing Sheets

(56) References Cited

U.S. PATENT DOCUMENTS

| | | | |
|---|---|---|---|
| 2021/0257194 A1 | 8/2021 | Birru et al. | |
| 2021/0257252 A1* | 8/2021 | Clemons | H01L 21/76837 |
| 2022/0062820 A1 | 3/2022 | Matsuba et al. | |
| 2023/0068823 A1* | 3/2023 | Lee | B04C 5/085 |
| 2024/0249925 A1* | 7/2024 | Kim | H01J 37/32844 |
| 2024/0339309 A1* | 10/2024 | Voronin | H01J 37/32357 |

FOREIGN PATENT DOCUMENTS

| | | | | |
|---|---|---|---|---|
| KR | 10-2017-0039295 A | 4/2017 | | |
| KR | 10-2078584 B1 | 2/2020 | | |
| KR | 10-2020-0139273 A | 12/2020 | | |
| KR | 10-2021-0010943 A | 1/2021 | | |
| KR | 10-2351585 B1 | 1/2022 | | |
| WO | WO 2015/134156 A1 | 9/2015 | | |
| WO | WO 2016/022233 A1 | 2/2016 | | |
| WO | WO 2019/212741 A1 | 11/2019 | | |
| WO | WO-2025048048 A1 * | 3/2025 | | B01D 53/30 |

\* cited by examiner

EXHAUST GAS PROCESSING APPARATUS HAVING PLASMA SOURCE AND SUBSTRATE PROCESSING APPARATUS INCLUDING THE SAME

CROSS-REFERENCE TO RELATED APPLICATION

This application claims benefit of priority to Korean Patent Application No. 10-2023-0007816, filed on Jan. 19, 2023, in the Korean Intellectual Property Office, the disclosure of which is incorporated herein by reference in its entirety.

BACKGROUND

1. Field

Embodiments relate to an exhaust gas processing apparatus having a plasma source and a substrate processing apparatus including the same.

2. Description of the Related Art

Process gases and byproducts may be discharged from a processing chamber during a deposition process, an etching process, and a cleaning process of a semiconductor device manufacturing process. Therefore, a method for discharging these gases may be required.

SUMMARY

According to embodiments, an exhaust gas processing apparatus includes a first chamber and a second chamber disposed in parallel between a processing chamber and an exhaust pump; at least one foreline connecting the first chamber and the second chamber to the processing chamber and the exhaust pump; a first plasma source connected to the first chamber and the second chamber; and a second plasma source connected to the first chamber and the second chamber, wherein the first plasma source generates a first treatment material, and the second plasma source generates a second treatment material different from the first treatment material.

According to embodiments, an exhaust gas processing apparatus includes a first chamber and a second chamber disposed between a processing chamber and an exhaust pump; a first plasma source connected to at least one of the first chamber and the second chamber; and a second plasma source connected to at least one of the first chamber and the second chamber, wherein the first plasma source generates a first treatment material, the second plasma source generates a second treatment material different from the first treatment material, and at least one of the first chamber and the second chamber is configured to process a first exhaust gas supplied from the processing chamber to generate a water-soluble second exhaust gas According to embodiments, a substrate processing apparatus includes a processing chamber; an exhaust gas processing apparatus connected to the processing chamber; an exhaust pump connected to the exhaust gas processing apparatus; and a scrubber connected to the exhaust pump through a scrubber pipe, wherein the exhaust gas processing apparatus includes: a first chamber and a second chamber disposed between a processing chamber and an exhaust pump; a first plasma source connected to at least one of the first chamber and the second chamber; and a second plasma source connected to at least one of the first chamber and the second chamber, wherein the first plasma source generates a first treatment material, the second plasma source generates a second treatment material different from the first treatment material, and the exhaust gas processing apparatus is configured to process a first exhaust gas supplied from the processing chamber in at least one of the first chamber and the second chamber to generate a water-soluble second exhaust gas.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, embodiments will be described with reference to the accompanying drawings.

Figure 1:
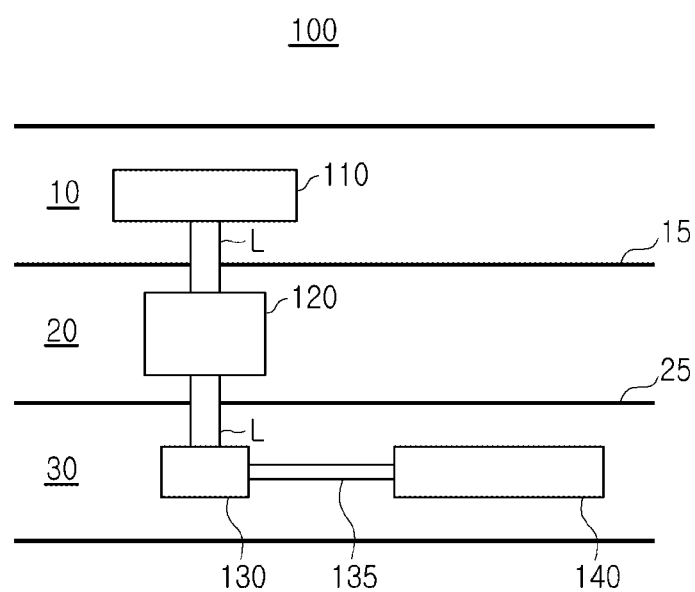
FIG. 1 is a diagram illustrating a substrate processing apparatus according to embodiments.

FIG. 1 is a schematic diagram illustrating a substrate processing apparatus according to embodiments.

Referring to FIG. 1, a substrate processing apparatus 100 according to an embodiment may include a processing chamber 110, an exhaust gas processing apparatus 120, an exhaust pump 130, and a scrubber 140. For example, as illustrated in FIG. 1, the processing chamber 110, the exhaust gas processing apparatus 120, the exhaust pump 130, and the scrubber 140 may be arranged sequentially in the order stated.

The processing chamber 110 may be used to process a semiconductor substrate, and may be configured to perform, e.g., at least one of a deposition process, an etching process, a plasma treatment process, a cleaning process, an ion implantation process, and the like. For example, the processing chamber 110 may be a chemical vapor deposition (CVD) chamber, an atomic layer deposition (ALD) chamber, a plasma etching chamber, or an ion implantation chamber. The processing chamber 110 may exhaust a processing gas, a reactant gas, and/or a purge gas used in a process of processing a semiconductor substrate. For example, the processing gas may be used to process the semiconductor substrate, the reactant gas may be a byproduct after processing the semiconductor substrate, and the purge gas may be a carrier gas for exhausting the processing gas or the reactant gas. In an embodiment, the processing chamber 110 may be a CVD chamber. For example, the processing chamber 110 may be used to deposit silicon oxide, and the exhaust gas exhausted from the processing chamber 110 may include a gas that has not participated in a reaction in a process gas used to deposit silicon oxide, a reactant gas, a purge gas, and the like. For example, the exhaust gas exhausted from the processing chamber 110 may include $Si(OC_2H_5)_4$ gas, which is tetraethyl orthosilicate (TEOS) gas.

The substrate processing apparatus 100 may include a fab 10, a clean sub fab (CSF) 20 below the fab 10, and a facility sub fab (FSF) 30 below the clean sub fab 20. The substrate processing apparatus 100 may further include a first partition 15, a second partition 25, a foreline L, and a scrubber pipe 135. The first partition 15 may spatially separate the fab 10 and the clean sub fab 20, and the second partition 25 may spatially separate the clean sub fab 20 and the facility sub fab 30. The foreline L may connect the processing chamber 110 to the exhaust gas processing apparatus 120, and may connect the exhaust gas processing apparatus 120 to the exhaust pump 130. The scrubber pipe 135 may connect the exhaust pump 130 to the scrubber 140.

Figure 2:
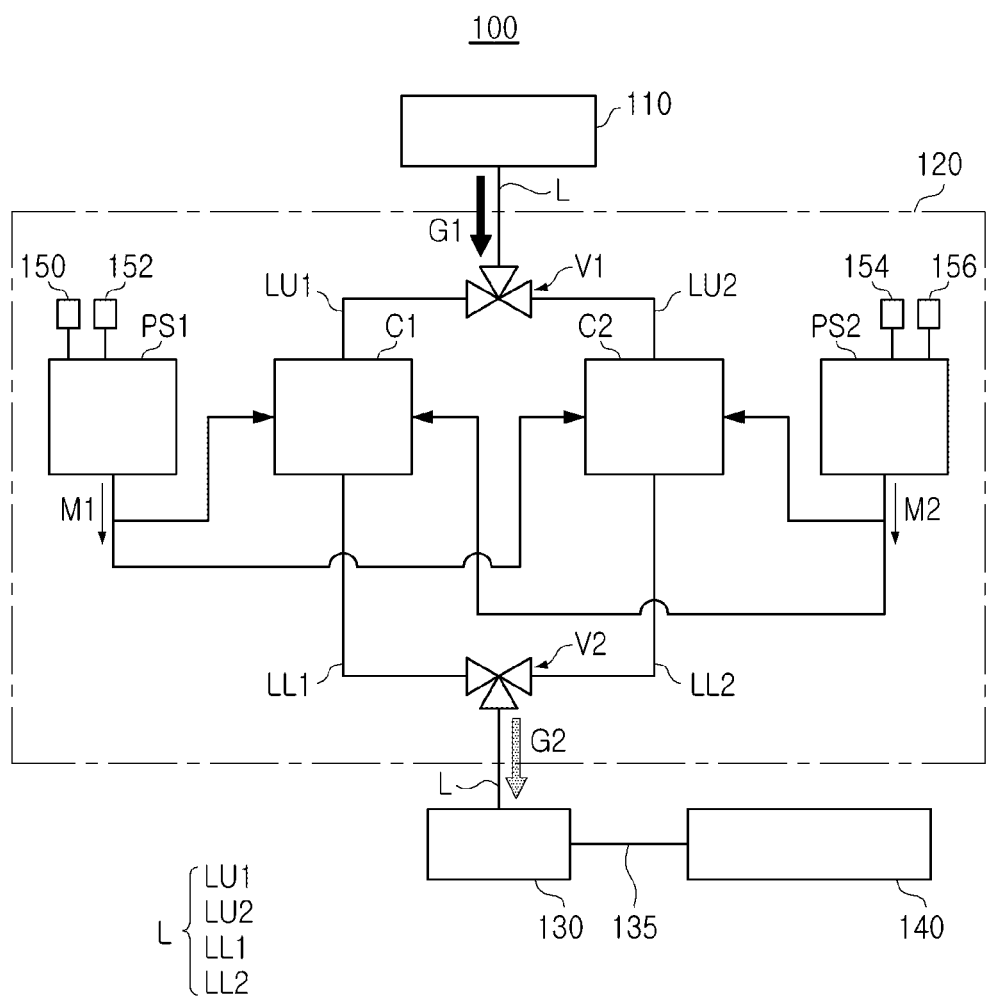
FIG. 2 is a diagram illustrating the exhaust gas processing apparatus in FIG. 1.

FIG. 2 is a schematic diagram illustrating the exhaust gas processing apparatus 120 in FIG. 1.

Referring to FIG. 2, the exhaust gas processing apparatus 120 may include a first chamber C1, a second chamber C2, a first plasma source PS1, and a second plasma source PS2. The exhaust gas processing apparatus 120 may receive a first exhaust gas G1 from the processing chamber 110, process the received first exhaust gas G1, and supply a second exhaust gas G2 to the exhaust pump 130. As described above, the first exhaust gas G1 may include TEOS gas.

The first chamber C1 and the second chamber C2 may be connected in parallel between the processing chamber 110 and the exhaust pump 130. For example, the first chamber C1 and the second chamber C2 may be respectively connected to two forelines L branched from one foreline L connected to the processing chamber 110. In an embodiment, the exhaust gas processing apparatus 120 may include a first upper foreline LU1, a second upper foreline LU2, a first lower foreline LL1, and a second lower foreline LL2. The first upper foreline LU1 and the second upper foreline LU2 may be connected to the first chamber C1 and the second chamber C2, respectively, and may be branched from the foreline L directly connected to the processing chamber 110. The first lower foreline LL1 and the second lower foreline LL2 may be connected to the first chamber C1 and the second chamber C2, respectively, and may be branched from the foreline L directly connected to the exhaust pump 130. In this specification, the forelines L may refer to pipes connecting the processing chamber 110, the first chamber C1, the second chamber C2, and the exhaust pump 130 to each other. In an embodiment, the first chamber C1 and the second chamber C2 may have the same size, shape, structure and material.

The exhaust gas processing apparatus 120 may further include a first valve V1 disposed between the processing chamber 110 and the first chamber C1 and the second chamber C2 and a second valve V2 disposed between the first chamber C1 and the second chamber C2 and the exhaust pump 130. Each of the first valve V1 and the second valve V2 may be a three-way valve to which three pipes are connected. For example, the first valve V1 may be connected to the processing chamber 110 by the foreline L. The first valve V1 may also be connected to the first chamber C1 by the first upper foreline LU1 and connected to the second chamber C2 by the second upper foreline LU2. The second valve V2 may be connected to the exhaust pump 130 by the foreline L. The second valve V2 may also be connected to the first chamber C1 by the first lower foreline LL1 and connected to the second chamber C2 by the second lower foreline LL2.

In an embodiment, the first valve V1 may open and close a fluid connection between the processing chamber 110 and the first chamber C1 and a fluid connection between the processing chamber 110 and the second chamber C2. Here, the 'fluid connection' refers to a state in which substances (e.g., gas, liquid, and solid) may flow in or out between components (i.e., elements) of the substrate processing apparatus 100. For example, the first valve V1 may be configured to selectively fluidly connect one of the first chamber C1 and the second chamber C2 to the processing chamber 110 (e.g., so only one of the first chamber C1 and the second chamber C2 is in fluid communication with the processing chamber 110 via the first valve V1), and may supply the first exhaust gas G1 to only the first chamber C1 or the second chamber C2 (e.g., to the chamber that is selectively set to be in fluid communication with the processing chamber 110). In an embodiment, the second valve V2 may open and close a fluid connection between the first chamber C1 and the exhaust pump 130 and a fluid connection between the second chamber C2 and the exhaust pump 130. For example, the second valve V2 may be configured to selectively fluidly connect one of the first chamber C1 and the second chamber C2 to the exhaust pump 130 (e.g., so only one of the first chamber C1 and the second chamber C2 is in fluid communication with the exhaust pump 130 via the second valve V2), and may receive the second exhaust gas G2 only from the first chamber C1 or the second chamber C2.

The first plasma source PS1 may be directly connected to the first chamber C1 and the second chamber C2, and the second plasma source PS2 may be directly connected to the first chamber C1 and the second chamber C2. The exhaust gas processing apparatus 120 may further include a first gas supply unit 150 and a second gas supply unit 152 connected to the first plasma source PS1, and may further include a third gas supply unit 154 and a fourth gas supply unit 156 connected to the second plasma source PS2. The first plasma source PS1 may generate plasma using gas supplied from at least one of the first gas supply unit 150 and the second gas supply unit 152. For example, the first gas supply unit 150 may be configured to supply oxygen gas ($O_2$) to the first plasma source PS1, and may generate oxygen radicals from the oxygen gas. The second gas supply unit 152 may be configured to supply a carrier gas to the first plasma source PS1, and the carrier gas may be used to transport oxygen radicals. The carrier gas may include an inert gas, e.g., argon (Ar) gas. The second plasma source PS2 may generate plasma using gas supplied from at least one of the third gas supply unit 154 and the fourth gas supply unit 156. For example, the third gas supply unit 154 may be configured to supply perfluoro compounds (PFC) gas to the second plasma source PS2, and the second plasma source PS2 may generate fluorine radicals from the PFC gas. The PFC gas may include at least one of, e.g., $NF_3$, $CF_3$, $CF_4$, $CHF_3$, $C_2F_6$, $C_3F_8$, $C_4F_8$, and $SF_6$. The fourth gas supply unit 156 may be configured to supply a carrier gas to the second plasma source PS2, and the carrier gas may be used to transport fluorine radicals. The carrier gas may include an inert gas, e.g., argon (Ar) gas.

The first plasma source PS1 and the second plasma source PS2 may include, e.g., at least one of an inductively coupled plasma (ICP) source, a capacitively coupled plasma (CCP) source, a direct current plasma source, a transformer coupled plasma (TCP), and microwave plasma. In an embodiment, the first plasma source PS1 may be directly connected to the first chamber C1 and the second chamber C2, and the second plasma source PS2 may be directly connected to the first chamber C1 and the second chamber C2.

In an embodiment, the first plasma source PS1 may generate a treatment material different from a treatment material generated by the second plasma source PS2. For example, the first plasma source PS1 may selectively supply a first treatment material M1 to one of the first chamber C1 and the second chamber C2, and the second plasma source PS2 may selectively supply a second treatment material M2 to one of the first chamber C1 and the second chamber C2, e.g., the first and second plasma sources PS1 and PS2 may supply the respective first and second treatment materials M1 and M2 to different ones of the first and second chambers C1 and C2. For example, the first treatment material M1 may include oxygen radicals and a carrier gas, and the second treatment material M2 may include fluorine radicals and a carrier gas. For example, when the first plasma source PS1 supplies the first treatment material M1 to the first chamber C1, the second plasma source PS2 may supply the second treatment material M2 to the second chamber C2. Alternatively, when the first plasma source PS1 supplies the first treatment material M1 to the second chamber C2, the second plasma source PS2 may supply the second treatment material M2 to the first chamber C1.

The exhaust pump 130 may receive the second exhaust gas G2 through the second valve V2 and supply the second exhaust gas G2 to the scrubber 140. For example, the exhaust pump 130 may generate negative pressure to receive the second exhaust gas G2 from at least one of the first chamber C1 and the second chamber C2. The second exhaust gas G2 may be formed as the first exhaust gas G1 reacts with at least one the first treatment material M1 and the second treatment material M2 in at least one of the first chamber C1 and the second chamber C2. For example, the second exhaust gas G2 may be generated by supplying the first treatment material M1 to the first exhaust gas G1 and then supplying the second treatment material M2. In an embodiment, the second exhaust gas G2 may be a water-soluble gas.

The scrubber 140 may receive the second exhaust gas G2 from the exhaust pump 130 through the scrubber pipe 135. The scrubber 140 may process and discharge the second exhaust gas G2. In an embodiment, the scrubber 140 may be a wet scrubber. For example, the scrubber 140 may dissolve the water-soluble second exhaust gas G2 in water, neutralize a dissolved solution, and discharge the neutralized solution.

Figure 3:
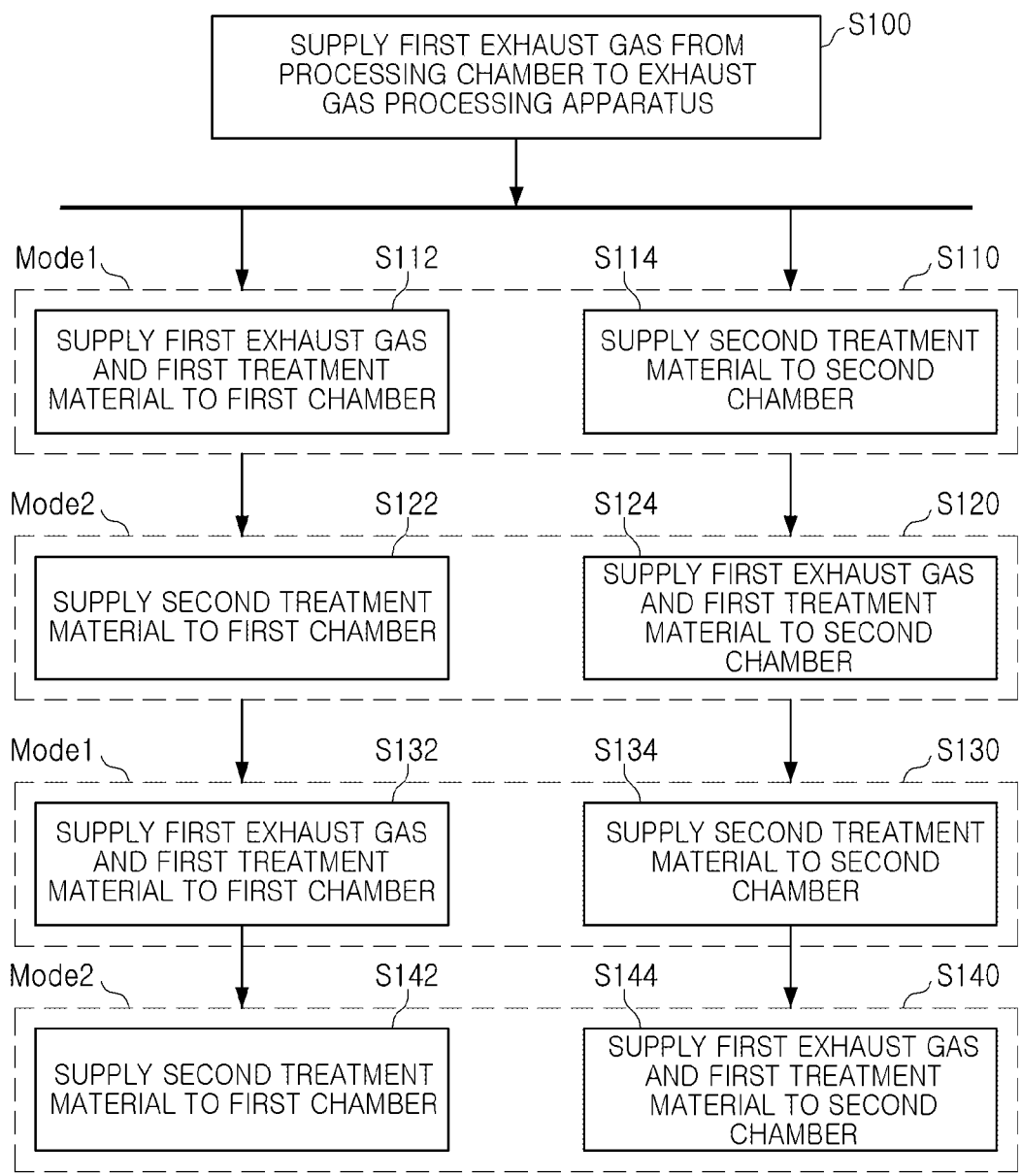
FIG. 3 is a flowchart illustrating an exhaust gas processing method according to an embodiment.
Figure 4:
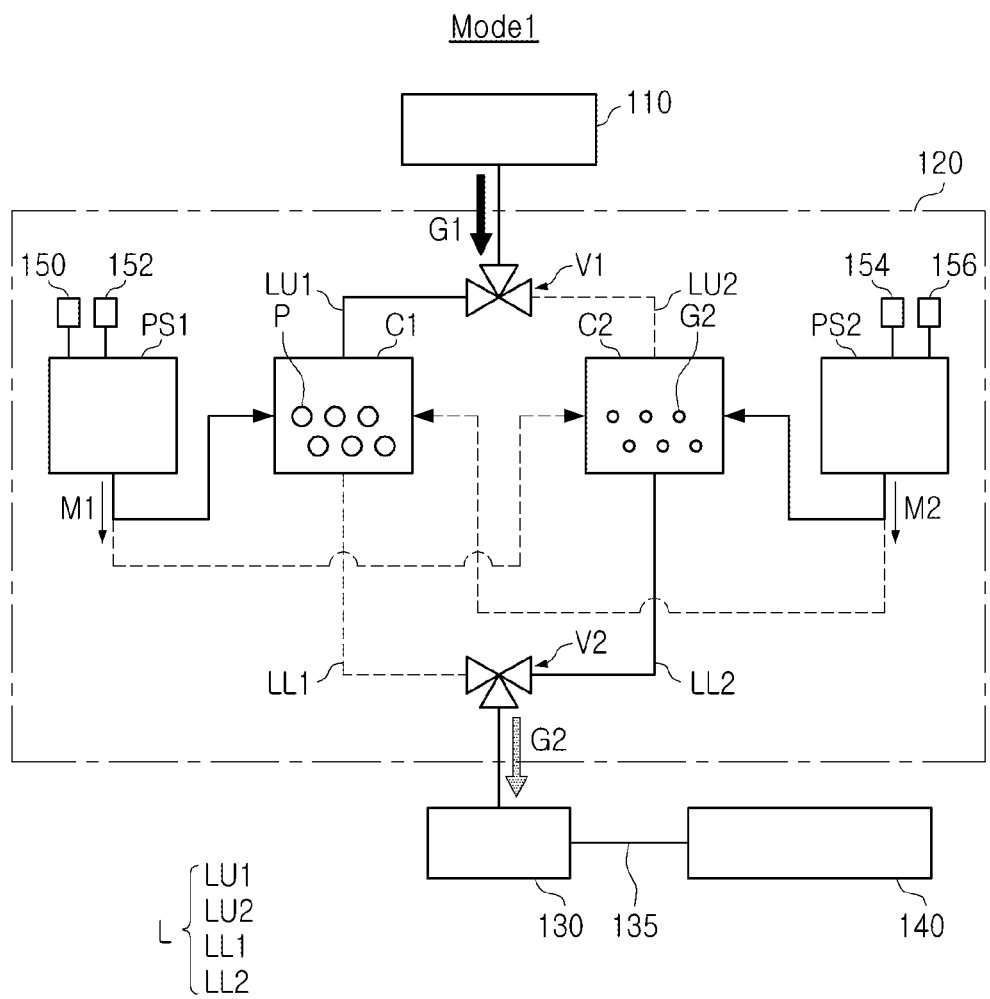
FIGS. 4 and 5 are diagrams illustrating an exhaust gas processing method according to an embodiment.
Figure 5:
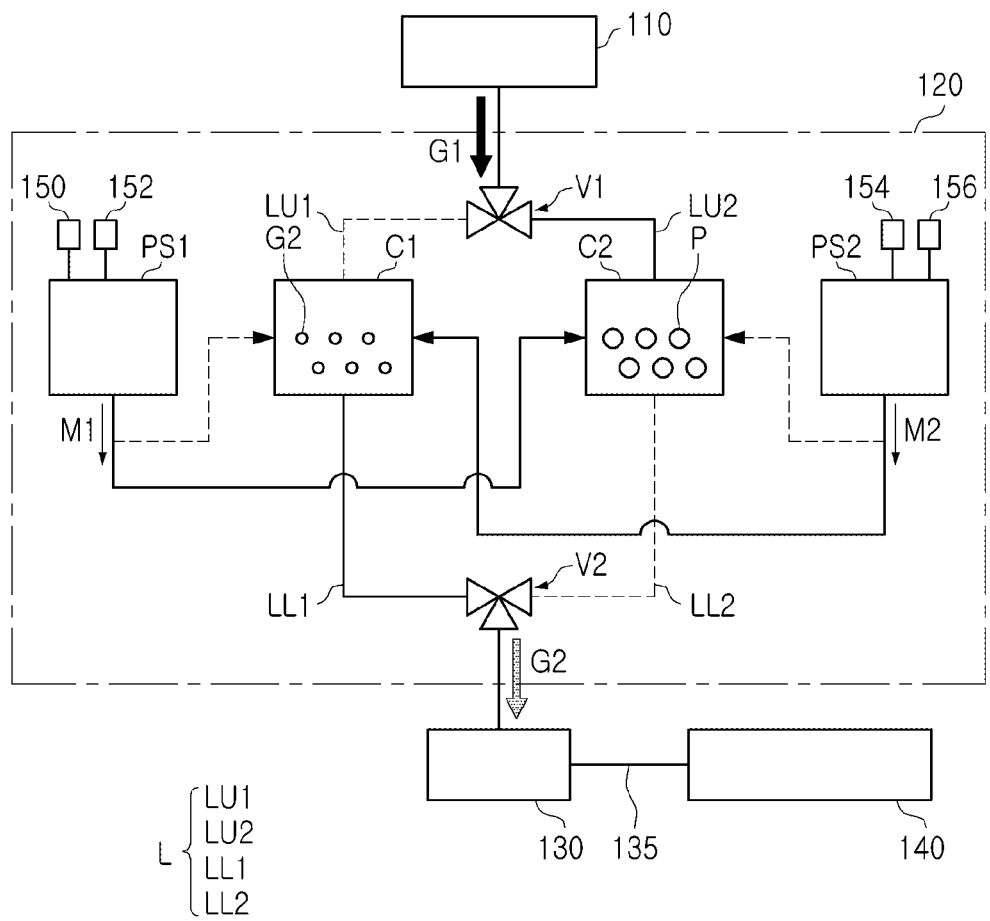

FIG. 3 is a flowchart illustrating an exhaust gas processing method according to an embodiment. FIGS. 4 and 5 are diagrams illustrating an exhaust gas processing method according to an embodiment.

Referring to FIGS. 2 and 3, the exhaust gas processing method may include supplying the first exhaust gas G1 from the processing chamber 110 to the exhaust gas processing apparatus 120 (S100), performing a first processing mode Mode1 (S110), and performing a second processing mode Mode2 (S120). Performing the first processing mode Mode1 (S110) may include supplying the first exhaust gas G1 and the first treatment material M1 to the first chamber C1 (S112) and supplying the second treatment material M2 to the second chamber C2 (S114). Performing the second processing mode Mode2 (S120) may include supplying the second treatment material M2 to the first chamber C1 (S122) and supplying the first exhaust gas G1 and the first treatment material M1 to the second chamber C2 (S124). In an embodiment, operation S112 may be performed concurrently with operation S114, and operation S122 may be performed concurrently with step 124.

The first processing mode Mode1 may be performed alternately with the second processing mode Mode2. For example, the exhaust gas processing method may further include performing the first processing mode Mode1 (S130) and performing the second processing mode Mode2 (S140) after operation S120. Performing the first processing mode Mode1 may include operations S132 and S134, which may be the same as operations S112 and S114, respectively. Performing the second processing mode Mode2 may include operations S142 and S144, which may be the same as operations S122 and S124, respectively. For example, as illustrated in FIG. 3, the first processing mode Mode1 and the second processing mode Mode2 may be repeated twice. In another example, the first processing mode Mode1 and the second processing mode Mode2 may be repeated three or more times. While the first processing mode Mode1 and the second processing mode Mode2 are repeated, the first exhaust gas G1 may be continuously supplied from the processing chamber 110 to the exhaust gas processing apparatus 120. Hereinafter, a process of processing the first exhaust gas G1, while repeating the first processing mode Mode1 and the second processing mode Mode2, will be described based on the first chamber C1 and the second chamber C2, respectively.

Referring to FIGS. 3 to 5, the first exhaust gas G1 may be supplied from the processing chamber 110 to the exhaust gas processing apparatus 120 (S100), the first processing mode Mode1 may be performed (S110 and S130), and the second processing mode Mode2 may be performed (S120 and S140).

As described above, in the first processing mode Mode1 (FIG. 4), the first exhaust gas G1 and the first treatment material M1 may be supplied to the first chamber C1. For example, the first plasma source PS1 may be fluidly connected to only the first chamber C1 and may supply the first treatment material M1 to the first chamber C1 (indicated with a solid line in FIG. 4). The first valve V1 may open only the fluid connection between the processing chamber 110 and the first chamber C1. That is, the processing chamber 110 may be fluidly connected to only the first chamber C1, and the first exhaust gas G1 may be supplied to only the first chamber C1 through the first valve V1 (indicated with a solid line in FIG. 4). The second plasma source PS2 and the exhaust pump 130 may not be fluidly connected to the first chamber C1 (indicated with a dashed line in FIG. 4). The first exhaust gas G1 supplied to the first chamber C1 may react with the first treatment material M1, and byproducts P may be generated. In an embodiment, the byproduct P may be solid powder. For example, the first exhaust gas G1 may include TEOS gas, the first treatment material M1 may include oxygen radicals, and the byproduct P may include silicon dioxide ($SiO_2$).

Thereafter, in the second processing mode Mode2 (FIG. 5), the second treatment material M2 may be supplied to the first chamber C1. For example, the second plasma source PS2 may be fluidly connected to only the first chamber C1 and may supply the second treatment material M2 to the first chamber C1 (indicated with a solid line in FIG. 5). The first chamber C1 may not be fluidly connected to the processing chamber 110 (indicated with a dashed line in FIG. 5). The second treatment material M2 supplied to the first chamber C1 may react with the byproduct P (generated in the first processing mode Mode1 in FIG. 4), and the second exhaust gas G2 may be generated. In an embodiment, the second exhaust gas G2 may be a water-soluble gas. For example, the second treatment material M2 may include fluorine radicals, and the second exhaust gas G2 may include silicon tetrafluoride (SiF$_4$) gas. The exhaust pump 130 may be fluidly connected to only the first chamber C1 (indicated with a solid line in FIG. 5), and the second exhaust gas G2 may be discharged to the scrubber 140 through the exhaust pump 130.

The processes S112 and S122 performed in the first chamber C1 in the first processing mode Mode1 and the second processing mode Mode2, respectively, may be performed in the second chamber C2 in the second processing mode Mode2 and the first processing mode Mode1, respectively. For example, operation S114 may be the same process as operation S122, and operation S124 may be the same process as operation S112.

Specifically, in the second processing mode Mode2 (FIG. 5), the first exhaust gas G1 and the first treatment material M1 may be supplied to the second chamber C2. For example, the first plasma source PS1 may be fluidly connected to only the second chamber C2 and may supply the first treatment material M1 to the second chamber C2. The first valve V1 may open only the fluid connection between the processing chamber 110 and the second chamber C2. That is, the processing chamber 110 may be fluidly connected to only the second chamber C2, and the first exhaust gas G1 may be supplied to only the second chamber C2 through the first valve V1. The second plasma source PS2 and the exhaust pump 130 may not be fluidly connected to the second chamber C2. The first exhaust gas G1 supplied to the second chamber C2 may react with the first treatment material M1, and the byproduct P may be generated.

Thereafter, in the first processing mode Mode1 (FIG. 4), the second treatment material M2 may be supplied to the second chamber C2. For example, the second plasma source PS2 may be fluidly connected to only the second chamber C2 and may supply the second treatment material M2 to the second chamber C2. The second chamber C2 may not be fluidly connected to the processing chamber 110. The second treatment material M2 supplied to the second chamber C2 may react with the byproduct P, and the second exhaust gas G2 may be generated. The exhaust pump 130 may be fluidly connected to only the second chamber C2, and the second exhaust gas G2 may be discharged to the scrubber 140 through the exhaust pump 130. The first chamber C1 and the second chamber C2 may have a temperature sufficient to process the first exhaust gas G1 and the byproduct P. For example, the temperature, e.g., in each, of the first chamber C1 and the second chamber C2 may be about 300° C. to about 800° C.

In this manner, while the first processing mode Mode1 and the second processing mode Mode2 are repeated, the byproduct P may be generated in one of the first chamber C1 and the second chamber C2, the second exhaust gas G2 may be generated in the other of the first chamber C1 and the second chamber C2. The first processing mode Mode1 and the second processing mode Mode2 may be performed for a predetermined time period, and each time period may be the same.

According to the exhaust gas processing apparatus 120, since the byproduct P, which is solid powder, is reacted with the second treatment material M2 and discharged as a water-soluble gas, a burn scrubber may not be used. Accordingly, since the discharged second exhaust gas G2 does not need to be incinerated using fuel, such as LNG, processing costs may be reduced. In addition, since the byproduct P, which is solid powder, is converted into the second exhaust gas G2 and discharged, rather than remaining in the exhaust gas processing apparatus 120, powder may be prevented from being accumulated in the foreline L, the exhaust pump 130, and the scrubber 140, and product life may increase. Since the first exhaust gas G1 discharged from the processing chamber 110 is continuously processed in the first chamber C1 or the second chamber C2, a change in pressure inside the processing chamber 110 may be reduced during the processing process.

Figure 6:
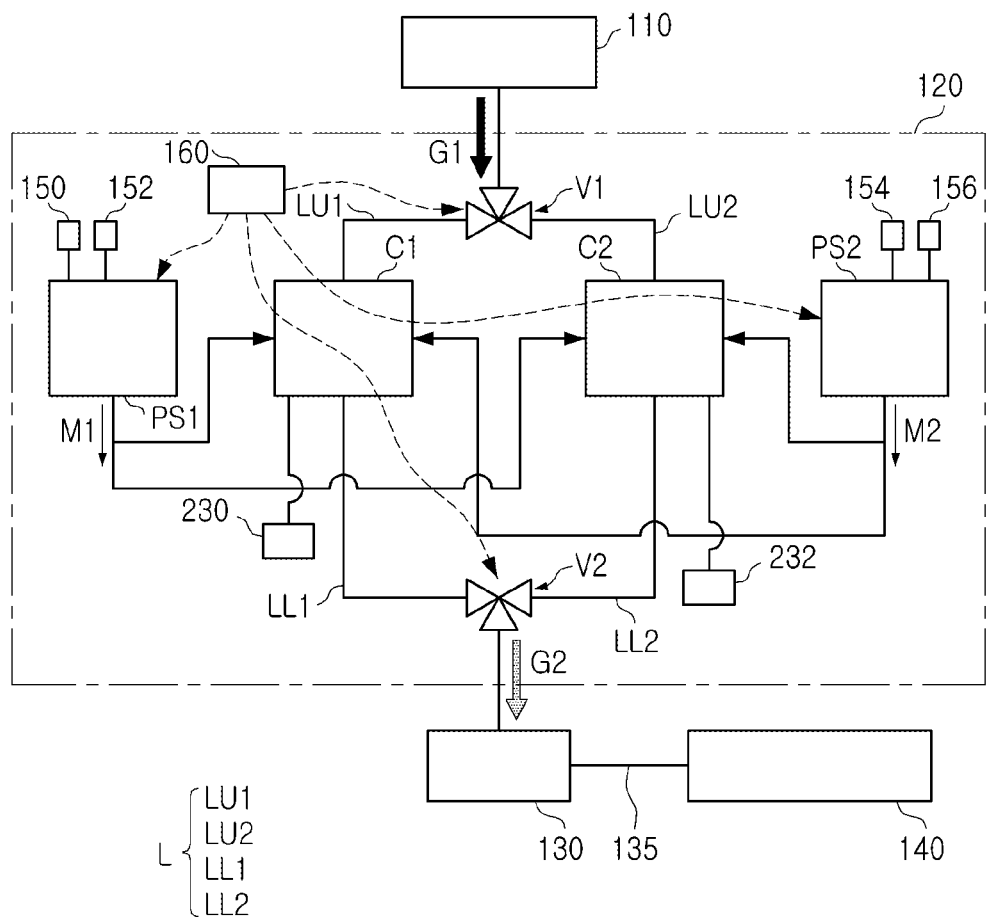
FIG. 6 is a diagram illustrating an exhaust gas processing apparatus according to an embodiment.

FIG. 6 is a diagram illustrating an exhaust gas processing apparatus according to an embodiment.

Referring to FIG. 6, the exhaust gas processing apparatus 120 of a substrate processing apparatus 200 may include a control unit 160 (e.g., a controller). In an embodiment, the control unit 160 may be configured to control the first plasma source PS1, the second plasma source PS2, the first valve V1, and the second valve V2. For example, the control unit 160 may fluidly connect the processing chamber 110 to only one of the first chamber C1 and the second chamber C2 by controlling the first valve V1. The control unit 160 may fluidly connect the exhaust pump 130 to only one of the first chamber C1 and the second chamber C2, by controlling the second valve V2. The control unit 160 may supply the first treatment material M1 to only one of the first chamber C1 and the second chamber C2 by controlling the first plasma source PS1. The control unit 160 may supply the second treatment material M2 to only one of the first chamber C1 and the second chamber C2 by controlling the second plasma source PS2. The control unit 160 may adjust a flow rate of the first treatment material M1 by controlling the first plasma source PS1, and may adjust a flow rate of the second treatment material M2 by controlling the second plasma source PS2.

In an embodiment, the exhaust gas processing apparatus 120 may include a first pump 230 connected to the first chamber C1 and a second pump 232 connected to the second chamber C2. The first pump 230 may operate only in the first processing mode Mode1 to supply the first exhaust gas G1 into the first chamber C1. The second pump 232 may operate only in the second processing mode Mode2 to supply the first exhaust gas G1 into the second chamber C2. The first pump 230 and the second pump 232 may form a negative pressure to adjust the pressure of the first exhaust gas G1 and reduce a change in pressure inside the processing chamber 110.

Figure 7:
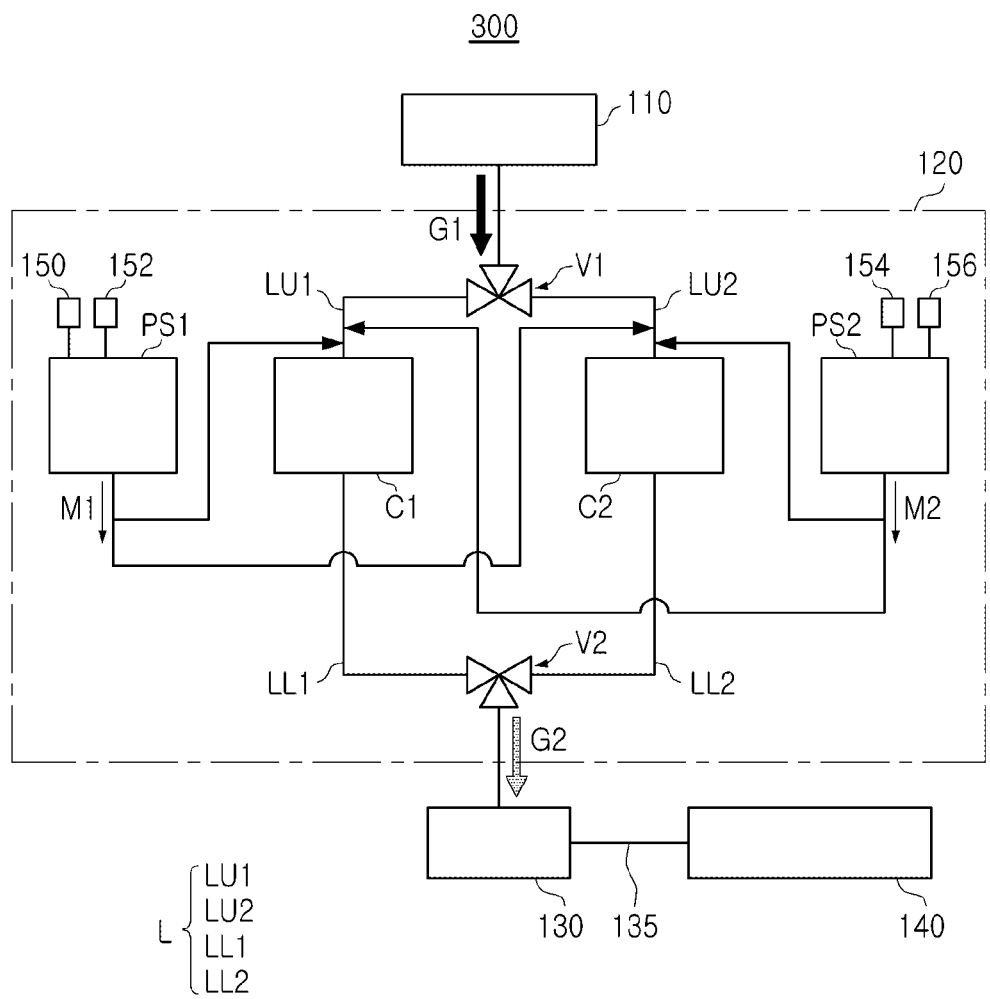
FIG. 7 is a diagram illustrating an exhaust gas processing apparatus according to an embodiment.

FIG. 7 is a diagram illustrating the exhaust gas processing apparatus 120 according to an embodiment.

Referring to FIG. 7, the exhaust gas processing apparatus 120 of a substrate processing apparatus 300 may include the first plasma source PS1 and the second plasma source PS2 respectively connected to the first chamber C1 and the second chamber C2. In an embodiment, the first plasma source PS1 and the second plasma source PS2 may not be directly connected to the first chamber C1 and the second chamber C2, but may be indirectly connected, respectively. For example, the first plasma source PS1 and the second plasma source PS2 may be directly connected to the first upper foreline LU1 and the second upper foreline LU2.

Figure 8:
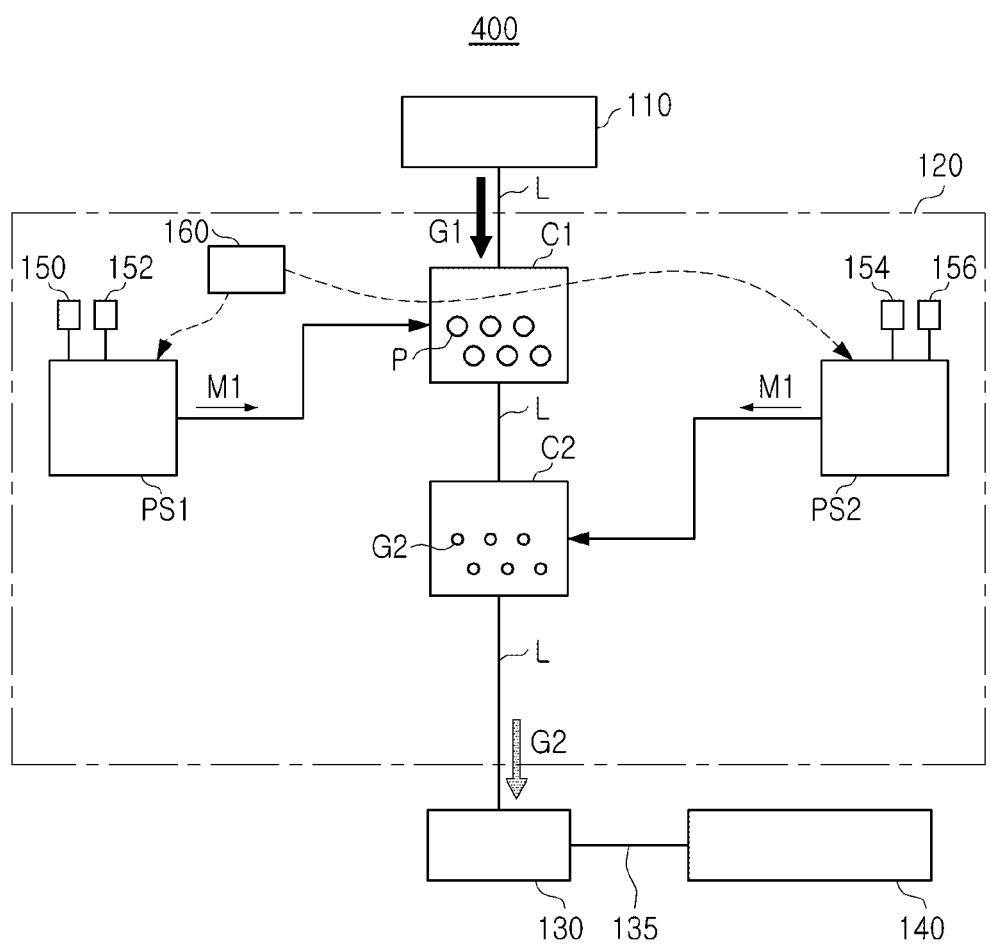
FIG. 8 is a diagram illustrating an exhaust gas processing apparatus according to an embodiment.

FIG. 8 is a diagram illustrating an exhaust gas processing apparatus according to an embodiment.

Referring to FIG. 8, the exhaust gas processing apparatus 120 of a substrate processing apparatus 400 may include the first chamber C1, the second chamber C2, the first plasma source PS1, and the second plasma source PS2. In an embodiment, the first chamber C1 and the second chamber C2 may be connected to each other in series between the processing chamber 110 and the exhaust pump 130. For example, the first chamber C1 may be connected to the processing chamber 110 by the foreline L, and the second chamber C2 may be connected to the first chamber C1 and the exhaust pump 130 by the foreline L.

The first plasma source PS1 may be connected to the first chamber C1, and the second plasma source PS2 may be connected to the second chamber C2. The first plasma source PS1 may generate a treatment material different from a treatment material generated by the second plasma source PS2. For example, the first plasma source PS1 may generate and supply the first treatment material M1 to the first chamber C1. The second plasma source PS2 may generate and supply the second treatment material M2 to the second chamber C2.

The exhaust gas processing apparatus 120 may further include the control unit 160 configured to control the first plasma source PS1 and the second plasma source PS2. For example, the control unit 160 may adjust a flow rate of the first treatment material M1 supplied by the first plasma source PS1 and adjust a flow rate of the second treatment material M2 supplied by the second plasma source PS2.

Figure 9:
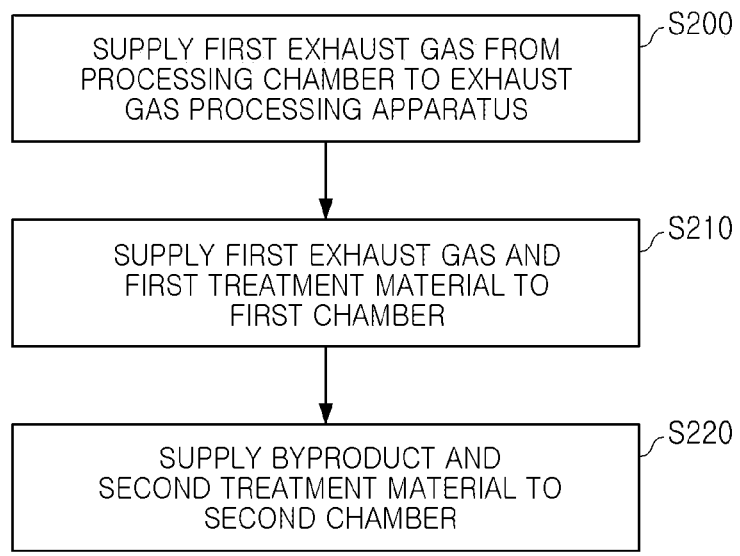
FIG. 9 is a flowchart illustrating an exhaust gas processing method according to an embodiment.

FIG. 9 is a flowchart illustrating an exhaust gas processing method according to an embodiment.

Referring to FIGS. 8 and 9, the exhaust gas processing method may include supplying the first exhaust gas G1 from the processing chamber 110 to the exhaust gas processing apparatus 120 (S200), supplying the first exhaust gas G1 and the first treatment material M1 to the first chamber C1 (S210), and supplying the second treatment material M2 to the second chamber C2 (S220).

In operation S200, the processing chamber 110 may be connected to only the first chamber C1, and the first exhaust gas G1 may be supplied to the first chamber C1. In operation S210, the first plasma source PS1 may supply the first treatment material M1 to the first chamber C1. The first exhaust gas G1 may react with the first treatment material M1 in the first chamber C1 to generate the byproduct P. In operation S220, the generated byproduct P may be supplied to the second chamber C2, and the second plasma source PS2 may supply the second treatment material M2 to the second chamber C2. In the second chamber C2, the byproduct P may react with the second treatment material M2 to generate the second exhaust gas G2. The generated second exhaust gas G2 may be discharged to the scrubber 140 through the exhaust pump 130.

As described above, since the first exhaust gas G1 is converted into the second exhaust gas G2, which is a water-soluble gas, and discharged, the product life of the exhaust pump 130 and the scrubber 140 may increase. Since the first chamber C1 and the second chamber C2 are connected to each other in series, a change in pressure inside the processing chamber 110 may be reduced when the exhaust gas processing apparatus 120 operates.

By way of summation and review, embodiments provide an exhaust gas processing apparatus having plasma sources converting an exhaust gas into a water-soluble gas.

According to embodiments, the exhaust gas treatment apparatus may include plasma sources generating different materials (e.g., oxygen radicals and fluorine radicals) to generate water-soluble gas. Since the plasma sources convert gas supplied from the processing chamber into water-soluble gas and discharge the same (e.g., thereby preventing powder from accumulating in an exhaust pump and a scrubber), the product life of the exhaust pump and the scrubber may increase. In addition, since water-soluble gas is dissolved in water and neutralized by using a wet scrubber, energy consumption may be reduced (e.g., compared to a burn scrubber in which emissions are incinerated with liquefied natural gas). Further, since each chemical reaction occurs sequentially in two chambers, a change in pressure of an exhaust gas discharged from the processing chamber and pressure inside the processing chamber may be reduced. The chambers may be arranged in parallel or in series.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An exhaust gas processing apparatus, comprising:
  a first chamber and a second chamber in parallel between a processing chamber and an exhaust pump;
  at least one foreline connecting the first chamber and the second chamber to the processing chamber and the exhaust pump;
  a first plasma source connected to the first chamber and the second chamber, the first plasma source being configured to generate a first treatment material; and
  a second plasma source connected to the first chamber and the second chamber, the second plasma source being configured to generate a second treatment material different from the first treatment material.

2. The exhaust gas processing apparatus as claimed in claim 1, further comprising:
  a first valve between the processing chamber and the first chamber and between the processing chamber and the second chamber; and
  a second valve between the first chamber and the exhaust pump and between the second chamber and the exhaust pump.

3. The exhaust gas processing apparatus as claimed in claim 2, wherein the first valve is configured to selectively fluidly connect one of the first chamber and the second chamber to the processing chamber.

4. The exhaust gas processing apparatus as claimed in claim 2, wherein the second valve is configured to selectively fluidly connect one of the first chamber and the second chamber to the exhaust pump.

5. The exhaust gas processing apparatus as claimed in claim 2, further comprising a controller configured to control the first valve and the second valve.

6. The exhaust gas processing apparatus as claimed in claim 1, wherein the first plasma source is configured to selectively supply the first treatment material to one of the first chamber and the second chamber.

7. The exhaust gas processing apparatus as claimed in claim 1, wherein the second plasma source is configured to selectively supply the second treatment material to one of the first chamber and the second chamber.

8. The exhaust gas processing apparatus as claimed in claim 1, wherein:
  when the first plasma source is in fluid communication with the first chamber, the second plasma source is in fluid communication with the second chamber, and
  when the first plasma source is in fluid communication with the second chamber, the second plasma source is in fluid communication with the first chamber.

9. The exhaust gas processing apparatus as claimed in claim 1, wherein the processing chamber is configured to supply a first exhaust gas, the first exhaust gas being processing in at least one of the first chamber and the second chamber to generate a second exhaust gas.

10. The exhaust gas processing apparatus as claimed in claim 9, wherein the second exhaust gas is a water-soluble gas.

11. The exhaust gas processing apparatus as claimed in claim 9, wherein the first exhaust gas includes tetraethyl orthosilicate (TEOS) gas, and the second exhaust gas includes silicon tetrafluoride ($SiF_4$) gas.

12. The exhaust gas processing apparatus as claimed in claim 9, wherein the second exhaust gas is generated from the first exhaust gas by alternately performing a first processing mode and a second processing mode.

13. The exhaust gas processing apparatus as claimed in claim 1, further comprising:
a first pump connected to the first chamber; and
a second pump connected to the second chamber.

14. The exhaust gas processing apparatus as claimed in claim 1, wherein:
the first plasma source and the second plasma source are directly connected to the first chamber and the second chamber, or
the first plasma source and the second plasma source are connected to the first chamber and the second chamber via the at least one foreline.

15. An exhaust gas processing apparatus, comprising:
a first chamber and a second chamber between a processing chamber and an exhaust pump;
a first plasma source connected to at least one of the first chamber and the second chamber, the first plasma source being configured to generate a first treatment material; and
a second plasma source connected to at least one of the first chamber and the second chamber, the second plasma source being configured to generate a second treatment material different from the first treatment material,
wherein at least one of the first chamber and the second chamber is configured to process a first exhaust gas supplied from the processing chamber to generate a water-soluble second exhaust gas.

16. The exhaust gas processing apparatus as claimed in claim 15, wherein the first chamber and the second chamber are disposed in parallel between the processing chamber and the exhaust pump.

17. The exhaust gas processing apparatus as claimed in claim 15, wherein the first chamber and the second chamber are connected to each other in series, the processing chamber being connected to the first chamber, and the second chamber being connected to the exhaust pump.

18. The exhaust gas processing apparatus as claimed in claim 17, wherein the first plasma source is connected to the first chamber and the second plasma source is connected to the second chamber.

19. The exhaust gas processing apparatus as claimed in claim 17, wherein:
in the first chamber, the first exhaust gas reacts with the first treatment material to generate a byproduct, and
the byproduct is supplied to the second chamber and reacts with the second treatment material to generate the second exhaust gas.

20. A substrate processing apparatus, comprising:
a processing chamber;
an exhaust gas processing apparatus connected to the processing chamber;
an exhaust pump connected to the exhaust gas processing apparatus; and
a scrubber connected to the exhaust pump through a scrubber pipe,
wherein the exhaust gas processing apparatus includes:
a first chamber and a second chamber between the processing chamber and the exhaust pump,
a first plasma source connected to the first chamber and the second chamber, the first plasma source being configured to generate a first treatment material, and
a second plasma source connected to the first chamber and the second chamber, the second plasma source being configured to generate a second treatment material different from the first treatment material, and
wherein the exhaust gas processing apparatus is configured to process a first exhaust gas supplied from the processing chamber in at least one of the first chamber and the second chamber to generate a water-soluble second exhaust gas.

* * * * *